United States Patent
Ohta et al.

(10) Patent No.: US 7,820,274 B2
(45) Date of Patent: Oct. 26, 2010

(54) PREPREG AND CONDUCTIVE LAYER-LAMINATED SUBSTRATE FOR PRINTED WIRING BOARD

(75) Inventors: Toshihiro Ohta, Aichi-ken (JP); Tomiho Yamada, Aichi-ken (JP); Shigeru Asami, Tokyo (JP)

(73) Assignee: NOF Corporation, Tokyo (JP)

( * ) Notice: Subject to any disclaimer, the term of this patent is extended or adjusted under 35 U.S.C. 154(b) by 213 days.

(21) Appl. No.: 11/755,374

(22) Filed: May 30, 2007

(65) Prior Publication Data
US 2007/0281566 A1    Dec. 6, 2007

(30) Foreign Application Priority Data
May 30, 2006    (JP) .............................. 2006-150527

(51) Int. Cl.
*B32B 3/00* (2006.01)
(52) U.S. Cl. ....................... 428/209; 174/258; 174/259; 428/297.4; 428/901
(58) Field of Classification Search ................. 428/209, 428/901; 174/258–259
See application file for complete search history.

(56) References Cited

U.S. PATENT DOCUMENTS

| | | |
|---|---|---|
| 2,805,181 A | 9/1957 | Groff et al. |
| 3,238,077 A | 3/1966 | Clark et al. |
| 3,240,662 A | 3/1966 | Smyers et al. |
| 6,420,476 B1 * | 7/2002 | Yamada et al. ............... 524/575 |
| 6,500,535 B1 * | 12/2002 | Yamada et al. ............... 428/327 |

FOREIGN PATENT DOCUMENTS

| | | |
|---|---|---|
| JP | 9-23047 A | 1/1997 |
| JP | 10-265592 A | 10/1998 |
| JP | 11-87910 A | 3/1999 |
| WO | 97/38564 A1 | 10/1997 |
| WO | 99/10435 A1 | 3/1999 |

\* cited by examiner

*Primary Examiner*—Cathy Lam
(74) *Attorney, Agent, or Firm*—Crompton, Seager & Tufte LLC

(57) ABSTRACT

A prepreg having low dielectric constant, low dielectric loss, and high heat cycle resistance. The prepreg includes a sheet-like preform and a resin-impregnated, sheet-like, fiber-reinforced material thermal pressure adhered to the sheet-like preform. The sheet-like preform includes a graft copolymer (a) in which 15 to 40 parts by mass of an aromatic vinyl monomer are grafted to 60 to 85 parts by mass of a random or block copolymer comprising monomer units selected from nonpolar α-olefin monomers and nonpolar conjugated diene monomers. The resin-impregnated, sheet-like, fiber-reinforced material includes a sheet-like, fiber-reinforced material (b1) and a thermoplastic resin (b2) into which the sheet-like, fiber-reinforced material (b1) is impregnated. The thermoplastic resin (b2) is a random or block copolymer composed of 60 to 90 mass % of a monomer unit, which is selected from nonpolar α-olefin monomers and nonpolar conjugated diene monomers, and 10 to 40 mass % of an aromatic vinyl monomer unit.

7 Claims, 1 Drawing Sheet

PREPREG AND CONDUCTIVE LAYER-LAMINATED SUBSTRATE FOR PRINTED WIRING BOARD

CROSS-REFERENCE TO RELATED APPLICATIONS

This application is based upon and claims the benefit of priority from prior Japanese Patent Application No. 2006-150527, filed on May 30, 2006, the entire contents of which are incorporated herein by reference.

BACKGROUND OF THE INVENTION

The present invention relates to a prepreg comprising a resin-impregnated, sheet-like, fiber-reinforced material that is thermal pressure adhered to a graft copolymer sheet-like preform, and more specifically to a prepreg having excellent high frequency signal transmission characteristics and excellent heat cycle resistance, and a conductive layer-laminated substrate for a printed wiring board manufactured by using the prepreg.

In order to increase the information transmission rates, communication devices and electronics devices use signals in high-frequency bands of from megahertz bands to gigahertz bands. However, the higher the frequency of an electric signal is, the more transmission loss occurs. There has been demanded an electrical insulating material that is applicable for transmitting high-frequency signals such as in gigahertz bands and that has excellent high frequency signal transmission characteristics. The transmission loss of a circuit contacted with an insulating material includes conductor loss that is determined by the shape, the skin resistance, and the characteristic impedance of the circuit (conductor); and dielectric material loss that is determined by the dielectric characteristics of an insulating layer (dielectric) around the circuit. The transmission loss may be radiated as the dielectric material loss from high-frequency circuits, and may be a factor that causes malfunctions of electronics devices. The dielectric material loss increases in proportion to the product of dielectric constant ($\in$) and dielectric loss (tan δ) of a material. In order to decrease the dielectric material loss, it is necessary to use a material that has both small dielectric constant and small dielectric loss.

As a material that has small dielectric constant and small dielectric loss, polymeric insulating materials, such as insulating thermoplastic resins and insulating thermosetting resins, are known. As the insulating thermoplastic resins, polyolefins, liquid crystal resins, and fluorinated resins have been proposed. As the insulating thermosetting resins, there have been proposed unsaturated polyester resins, polyimide resins, epoxy resins, bismaleimide-triazine resins (BT resins), curable polyphenylene oxides, and curable polyphenylene ethers.

In particular, as a material that has small dielectric constant and small dielectric loss in high-frequency bands, there are known polytetrafluoroethylene (see Japanese Patent Laid-Open Publication No. 11-087910), liquid crystal resins (see Japanese Patent Laid-Open Publication No. 09-23047), and modified polyolefin resins (see WO99/10435). The polytetrafluoroethylene particularly exhibits excellent high frequency signal transmission characteristics, however, has drawbacks of difficulties in processing and high cost. The liquid crystal resins are excellent in cost and processability, but, lacks high frequency signal transmission characteristics.

The modified polyolefin resins are appropriate in terms of cost, processability and high frequency signal transmission characteristics, and thus have been expected as useful electrical insulating materials. However, the modified polyolefin resins are highly resistant to solvents. Therefore, the modified polyolefin resins cannot be used in method for manufacturing a prepreg by dissolving a resin in a solvent and impregnating the solvent into a sheet-like, fiber-reinforced material such as a glass cloth.

WO99/10435 discloses a method that enables use of the modified polyolefin resins for manufacturing a prepreg. Specifically, there is disclosed a method of forming films with a modified polyolefin resin, sandwiching a sheet-like, fiber-reinforced material between the films and conducting thermal pressure adhesion.

This method requires that a glass cloth is impregnated with a molten resin. However, when the modified polyolefin resins are crosslinked resins, the resins do not show steep increase of flowability in temperatures more than or equal to melting points. Therefore, it is not easy that the glass cloth in a prepreg is fully impregnated with the modified polyolefin resins, and voids can remain within the glass cloth. Application of heat cycles such as repetition of cooling and heating to a prepreg or a conductive layer-laminated substrate for a printed wiring board can generate cracks in a resin layer due to repetition of swelling and shrinking of the confined voids.

In order to reduce the generation of cracks, an effective method is to impregnate a resin that behaves in an analogous fashion to a resin constituting a prepreg in behavior of swelling and shrinking into voids of a glass cloth. Japanese Patent Laid-Open Publication No. 10-265592 discloses a method for manufacturing a prepreg by subjecting a glass cloth into which a varnish obtained by dissolving a styrene-ethylene-butylene-styrene copolymer or a modified polyphenylene ether in a solvent is impregnated and a film of syndiotactic polystyrene, which is a thermoplastic resin, to thermal pressure adhesion. Use of this method makes it possible to impregnate the voids of the glass cloth and reduce swelling of the prepreg at the time of high temperature heating.

According to the method disclosed in Japanese Patent Laid-Open Publication No. 10-265592, a prepreg is manufactured by subjecting a syndiotactic polystyrene film to thermal pressure adhesion with a glass cloth in temperatures more than or equal to the melting point of syndiotactic polystyrene. However, the syndiotactic polystyrene melts and exhibits high flowability at the time of thermal pressure adhesion, and it is difficult to control a prepreg to have a desired thickness. In addition, in order to prevent sagging due to heat caused by flowability of molten syndiotactic polystyrene, it is necessary to use large amounts of glass-fiber reinforcements. However, the more the amount of the glass-fiber reinforcements in a prepreg become, the more areas of contact between the inorganic material and the organic material that have considerably different rates of swelling increase. In this case, the inorganic material tends to break away from the organic material, and thus heat cycle resistance certainly deteriorates even though apparent voids are reduced.

Japanese Patent Laid-Open Publication No. 10-265592 discloses use of a resin to which a polar functional group is introduced such as maleic acid for the purpose of reducing the voids. However, when affinity between a resin and a glass-fiber reinforcement is enhanced by introducing a polar group, the interaction between the polar group and the glass-fiber reinforcement deteriorates dielectric constant and dielectric loss of a prepreg in high-frequency bands rather than increases dipole moment of the resin. Therefore, the prepreg according to Japanese Patent Laid-Open Publication No. 10-265592 is not suitable for application in a printed wiring board for high-frequency bands.

SUMMARY OF THE INVENTION

The object of the present invention is to provide a prepreg and a conductive layer-laminated substrate having low dielectric constant, low dielectric loss, and high heat cycle resistance and suitable for manufacturing a printed wiring board.

One aspect of the present invention is a prepreg including a sheet-like preform and a resin-impregnated, sheet-like, fiber-reinforced material thermal pressure adhered to the sheet-like preform. The sheet-like preform includes a graft copolymer (a) in which 15 to 40 parts by mass of an aromatic vinyl monomer are grafted to 60 to 85 parts by mass of a random or block copolymer comprising monomer units selected from nonpolar α-olefin monomers and nonpolar conjugated diene monomers. The resin-impregnated, sheet-like, fiber-reinforced material includes a sheet-like, fiber-reinforced material (b1) and a thermoplastic resin (b2) into which the sheet-like, fiber-reinforced material (b1) is impregnated. The thermoplastic resin (b2) is a random or block copolymer composed of 60 to 90 mass % of a monomer unit, which is selected from nonpolar α-olefin monomers and nonpolar conjugated diene monomers, and 10 to 40 mass % of an aromatic vinyl monomer unit.

A further aspect of the present invention is a conductive layer-laminated substrate for a printed wiring board for high-frequency bands. The conductive layer-laminated substrate includes the prepreg and a conductive layer laminated on at least one major surface of the prepreg.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiment together with the accompanying drawings in which.

DETAILED DESCRIPTION OF THE PREFERRED EMBODIMENT

Hereinafter, prepregs according to a preferred embodiment of the present invention will be described.

Figure 1:
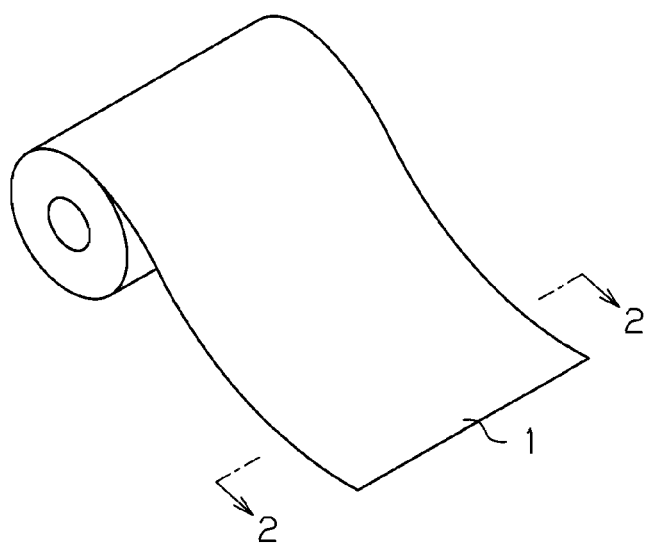
FIG. 1 shows a prepreg according to a preferred embodiment of the present invention.
Figure 2:
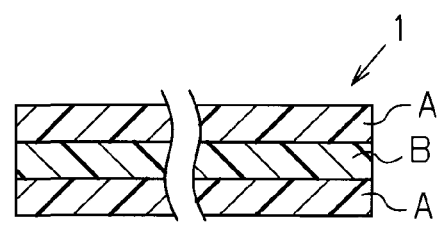
FIG. 2 is a cross-sectional view of the prepreg of FIG. 1.

As shown in FIGS. 1 and 2, a prepreg 1 according to the preferred embodiment is a laminate material manufactured by thermal pressure adhesion of a sheet-like preform (A), which is formed with a graft copolymer (a), with a resin-impregnated, sheet-like, fiber-reinforced material (B), which is prepared by impregnating a sheet-like, fiber-reinforced material (b1) with a thermoplastic resin (b2). In the illustrated embodiment, the resin-impregnated, sheet-like, fiber-reinforced material B is sandwiched between two sheets of the sheet-like preform (A). The thicknesses of the components A and B in FIG. 2 are not to scale.

The graft copolymer (a) is prepared by grafting 15 to 40 parts by mass of an aromatic vinyl monomer to 60 to 85 parts by mass of a random or block copolymer comprising monomer units selected from nonpolar α-olefin monomers and nonpolar conjugated diene monomers.

The sheet-like, fiber-reinforced material (b1) is prepared, for example, by impregnating a glass cloth with a varnish. The sheet-like, fiber-reinforced material (b1) has the capability of imparting a given rigidity to the prepreg.

The thermoplastic resin (b2) is a random or block copolymer comprising 60 to 90 mass % of a monomer unit selected from nonpolar α-olefin monomers and nonpolar conjugated diene monomers; and 10 to 40 mass % of an aromatic vinyl monomer unit.

According to "Polymer Dictionary", 5th edition published by TAISEISHA LTD., a prepreg is defined as a non-adhesive semicured molding material that is manufactured by impregnating a reinforced plastics resin to which a curing agent or an additive is added into a clothlike reinforcing material such as a glass cloth. In the preferred embodiment, the curing agent is not always used and use of the curing agent is not essential. Then non-adhesive semicured molding materials that are manufactured by methods similar to the definitions of the dictionary are referred to as prepregs.

Dielectric constant ($\in$) is the ratio of the permittivity to the vacuum permittivity, and measured by the perturbation method with a cavity resonator at a frequency of 10 GHz.

Melt Mass Flow Rate (MFR) is measured as an extrusion rate of a resin that is melted at 230 degrees Celsius and extruded from a nozzle under a load condition of 10 kgf for 10 minutes unless other measurement conditions are referred. Specifically, see JIS K7210: 1999 "Plastics—Determination of the melt mass-flow rate (MFR) and the melt volume-flow rate (MVR) of thermoplastics".

The heat cycle resistance of a prepreg is measured as follows. First, a prepreg on which an electrical circuit is formed is placed under a loaded condition of alternating low temperature and high temperature. Disconnections of the electrical circuit and destruction of the surface of the prepreg are observed. When no disconnections or destruction are observed, the prepreg is assumed to have high heat cycle resistance. An example of the loaded condition of low temperature is −55 degrees Celsius for 30 minutes. An example of the loaded condition of high temperature is +105 degrees Celsius for 30 minutes.

Next, each component of the prepreg will be described.

<Graft Copolymer (a)>

The graft copolymer (a) is prepared by grafting 15 to 40 parts by mass of an aromatic vinyl monomer to 60 to 85 parts by mass of a random or block copolymer comprising monomer units selected from nonpolar α-olefin monomers and nonpolar conjugated diene monomers.

Each constitutional unit of the graft copolymer (a), namely the nonpolar α-olefin monomers, the nonpolar conjugated diene monomers, and the aromatic vinyl monomer have structures substantially consisting of only hydrocarbon groups or hydrocarbon skeletons and do not include polar groups or polar skeletons having high dipole moment. Therefore, use of such monomers contributes to manufacturing of polymers with enhanced high frequency signal transmission characteristics. The graft copolymer (a) is considered to have a molecular shape in which domains, namely side chains, formed with the aromatic vinyl monomer unit having pi electron interactions are grafted to the main chain formed with the random or block copolymer comprising monomer units selected from nonpolar α-olefin monomers and nonpolar conjugated diene monomers. This graft structure enables the graft copolymer (a) to partially dissolve in solvents while the graft copolymer (a) does not turn into liquid with high flowability even in temperatures more than or equal to the melting point of the graft copolymer (a). Therefore, flow of the graft copolymer (a), namely sagging due to heat, is prevented.

As the nonpolar α-olefin monomers, ethylene, propylene, butene, octene, 4-methylpentene-1,2,4,4-trimethylpentene-1, or the like may be used. As the nonpolar conjugated diene monomers, 1,3-butadiene, 2-methyl-1,3-butadiene, or the like may be used.

The main chain of the graft copolymer (a) (hereinafter, referred to as a matrix polymer) is constituted of a random or block copolymer comprising monomer units selected from the nonpolar α-olefin monomers and the nonpolar conjugated diene monomers. The monomer units selected from nonpolar α-olefin monomers and nonpolar conjugated diene monomers may be a mixture of a nonpolar α-olefin monomer unit and a nonpolar conjugated diene monomer unit; a mixture of plural types of nonpolar α-olefin monomer units; or a mixture of plural types of nonpolar conjugated diene monomer units. The nonpolar conjugated diene monomer units in the matrix polymer may be partially hydrogenated.

The side chain of the graft copolymer (a) is constituted of an aromatic vinyl monomer. As the aromatic vinyl monomer, for example, monofunctional monomers such as styrene, p-methyl styrene, or p-ethyl styrene, or multifunctional monomers such as divinylbenzene may be used. Such monomers may be used alone or in combination of two or more monomers.

The ratio of the aromatic vinyl monomer in the graft copolymer (a) is 15 to 40 mass %, and preferably 25 to 35 mass %. The graft copolymer (a) having the aromatic vinyl monomer in the ratio of less than 15 mass % exhibits properties peculiar to α-olefin polymers or nonpolar conjugated diene polymers and extremely high flowability in temperatures more than or equal to the melting point. As a result, some efforts are required in maintaining the shape of the prepreg or controlling the thickness of the prepreg. On the other hand, the graft copolymer (a) having the aromatic vinyl monomer in the ratio of more than 40 mass % provides a brittle prepreg. As a result, it is difficult to process the prepreg into a molded article (for example, a conductive layer-laminated substrate for a printed wiring board).

The amount of multifunctional aromatic vinyl monomer in the aromatic vinyl monomer (side chains) of the graft copolymer (a) is preferably 2 to 30 mass %, and more preferably 15 to 25 mass %. Too much ratio of multifunctional aromatic vinyl monomer in the aromatic vinyl monomer of side chains provides a brittle prepreg. As a result, it is difficult to process the prepreg into a molded article (for example, a conductive layer-laminated substrate for a printed wiring board).

The molecular weight of the graft copolymer (a) is suitably defined as the flowability of the graft copolymer (a). The MFR value of the graft copolymer (a) is preferably 2 to 50 g/(10 min), and more preferably 5 to 15 g/(10 min). When the MFR value is less than 2 g/(10 min), a prepreg having insufficient mechanical properties is formed. When the graft copolymer (a) has the MFR value more than 50 g/(10 min), it is difficult to form the sheet-like preform (A) that has sufficient affinity for the sheet-like, fiber-reinforced material (b1). Insufficient affinity of the sheet-like preform (A) deteriorates heat cycle resistance of a molded article (for example, a conductive layer-laminated substrate for a printed wiring board) processed from a prepreg.

Preparation of the graft copolymer (a) will be described. The graft copolymer (a) can be manufactured by graft polymerization according to the chain transfer method or the ionizing radiation irradiation method. A preferred method is the impregnation graft polymerization method, which provides high graft efficiency, does not cause secondary aggregation due to heat, easily realizes desired properties, and is convenient.

Manufacturing of the graft copolymer (a) according to the impregnation graft polymerization method will be described.

First, at least one monomer selected from nonpolar α-olefin monomers and nonpolar conjugated diene monomers is polymerized to prepare a homopolymer or copolymer (hereinafter, referred to as a matrix polymer). 100 parts by mass of this matrix polymer is suspended in water to prepare an aqueous suspension.

One, two or more radical copolymerizable organic peroxides, and a radical polymerization initiator in which the temperature at which half of the initiator decomposes for 10 hours (the 10-hour half life temperature) is 40 to 90 degrees Celsius are dissolved in 5 to 400 parts by mass of an aromatic vinyl monomer to prepare a solution of the aromatic vinyl monomer. The radical copolymerizable organic peroxides are controlled to be 0.1 to 10 parts by mass to 100 parts by mass of the aromatic vinyl monomer. The radical polymerization initiator is controlled to be 0.01 to 5 parts by mass to 100 parts by mass of the total of the aromatic vinyl monomer and the radical copolymerizable organic peroxides.

The solution of the aromatic vinyl monomer is mixed with the aqueous suspension so that the radical copolymerizable organic peroxides are impregnated into (absorbed by) each suspended particle of the matrix polymer. In each suspended particle of the matrix polymer, islands of the absorbed radical copolymerizable organic peroxides are dispersed. This aqueous suspension is heated under conditions that the radical polymerization initiator substantially does not decompose to copolymerize the aromatic vinyl monomer and the radical copolymerizable organic peroxides in the particles of the matrix polymer to prepare a grafted precursor.

The grafted precursor is melted and kneaded at 100 to 300 degrees Celsius to prepare the target graft copolymer.

Alternatively, the graft copolymer may be prepared by mixing the grafted precursor with a polymer or copolymer, which is different from the matrix polymer, derived from at least one monomer selected from nonpolar α-olefin monomers and nonpolar conjugated diene monomers or a polymer derived from an aromatic vinyl monomer; and melting and kneading the mixture at 100 to 300 degrees Celsius.

The radical copolymerizable organic peroxides are molecules that have both properties of radical copolymerizable monomers and properties of organic peroxides. Examples of the radical copolymerizable organic peroxides may include: t-butyl peroxyacryloyloxyethyl carbonate, t-butyl peroxymethacryloyloxyethyl carbonate, t-butyl peroxyallyl carbonate, t-butyl peroxymethallyl carbonate, and the like. A preferred radical copolymerizable organic peroxide is t-butyl peroxymethacryloyloxyethyl carbonate.

<Sheet-Like Fiber-Reinforced Material (b1)>

The sheet-like, fiber-reinforced material (b1) imparts rigidity suitable for applications to conductive layer-laminated substrate for a printed wiring boards to the prepreg. A preferred material for the sheet-like, fiber-reinforced material (b1) is glass because glass enhances high frequency signal transmission characteristics. As the glass, E glass, C glass, A glass, S glass in which dielectric properties are improved by increasing the content of silicon dioxide ($SiO_2$), D glass, or silica glass may be used. Examples of the form of the sheet-like, fiber-reinforced material (b1) may include: continuous mat, cloth, nonwoven fabric, roving cloth, surfacing mat, chopped strand mat, and the like. The form is selected depending on the uses and properties of printed wiring boards. A preferred form of the sheet-like, fiber-reinforced material (b1) is cloth.

The sheet-like, fiber-reinforced material (b1) may be optionally subjected to an insulating coating treatment or surface treatments with silane compounds (chlorosilane, alkoxysilane, organic functional silane, and silazane), titanate or aluminum coupling agents, or the like as long as the treatments do not adversely affect high frequency signal transmission characteristics.

The ratio of the sheet-like, fiber-reinforced material (b1) in the resin-impregnated, sheet-like, fiber-reinforced material (B) is preferably 40 to 85 mass %, and more preferably 55 to 65 mass %. When the ratio of the sheet-like, fiber-reinforced material (b1) is less than 40 mass %, flowability of the thermoplastic resin (b2) cannot be reduced sufficiently at the time of processing a prepreg into a molded article, and thus it becomes difficult to manufacture the molded article. On the other hand, when the ratio of the sheet-like, fiber-reinforced material (b1) is more than 85 mass %, a prepreg lacks high frequency signal transmission characteristics, and the prepreg lacks heat cycle resistance even if the amounts of the thermoplastic resin (b2) is increased.

<Thermoplastic Resin (b2)>

The thermoplastic resin (b2) is a random or block copolymer comprising a monomer unit selected from nonpolar α-olefin monomers and nonpolar conjugated diene monomers; and an aromatic vinyl monomer unit. Each monomer unit substantially consists of only hydrocarbon groups or hydrocarbon skeletons and does not include polar groups or polar skeletons having high dipole moment. Therefore, the thermoplastic resin (b2) can have excellent high frequency signal transmission characteristics. Furthermore, as a result of random or block copolymerization, micro portions consisting of each monomer unit are dispersed in the thermoplastic resin (b2). In this structure, the thermoplastic resin (b2) has an enhanced affinity for the sheet-like, fiber-reinforced material (b1) due largely to micro portions of the aromatic vinyl monomer unit. In addition, micro portions of both monomer units enhance compatibility of the thermoplastic resin (b2) with the graft copolymer (a). Furthermore, the thermoplastic resin (b2) does not have the graft structure, and thus has excellent solubility in solvents. Therefore, the thermoplastic resin (b2) is easily processed into a varnish, and can be easily combined with the sheet-like, fiber-reinforced material (b1).

The nonpolar α-olefin monomers, the nonpolar conjugated diene monomers, and the aromatic vinyl monomer for preparing the thermoplastic resin (b2) are the same as the various monomers that can be used for preparing the graft copolymer (a). The nonpolar conjugated diene monomers in the thermoplastic resin (b2) may be partially hydrogenated.

In the thermoplastic resin (b2), the ratio of the aromatic vinyl monomer is 10 to 40 mass %, and preferably 15 to 30 mass %. When a multifunctional aromatic vinyl monomer is used as the aromatic vinyl monomer, its ratio in the thermoplastic resin (b2) is preferably less than or equal to 2 mass %. When the ratio of the aromatic vinyl monomer is more than 40 mass % or the ratio of the multifunctional aromatic vinyl monomer is more than 2 mass %, the thermoplastic resin (b2) that lacks flowability is prepared. Such a thermoplastic resin (b2) does not have enough adhesion to the graft copolymer (a), and has low solubility in solvents, whereby it is difficult to combine the thermoplastic resin (b2) with the sheet-like, fiber-reinforced material (b1). The thermoplastic resin (b2) in which the ratio of the aromatic vinyl monomer is less than 10 mass % exhibits extremely high flowability and outflows due to heating during manufacturing a prepreg. As a result, an excellent prepreg cannot be manufactured.

When both a monofunctional aromatic vinyl monomer and a multifunctional aromatic vinyl monomer are used as the aromatic vinyl monomer, the multifunctional aromatic vinyl monomer is preferably less than or equal to 2 mass % in the aromatic vinyl monomer. When the multifunctional aromatic vinyl monomer is more than 2 mass %, the thermoplastic resin (b2) hardly exhibit flowability, compatibility between the thermoplastic resin (b2) and the graft copolymer (a) lacks, and thus a prepreg lacks heat cycle resistance.

The molecular weight of the thermoplastic resin (b2) is suitably defined by its flowability. The MFR value of the thermoplastic resin (b2) is preferably 2 to 50 g/(10 min), and more preferably 5 to 15 g/(10 min). When the MFR value is less than 2 g/(10 min), the thermoplastic resin (b2) outflows due to heating during manufacturing a prepreg and thus an excellent prepreg cannot be manufactured. On the other hand, when the MFR value is more than 50 g/(10 min), the thermoplastic resin (b2) has insufficient affinity for the sheet-like, fiber-reinforced material (b1), and thus a prepreg lacks heat cycle resistance.

The ratio of the thermoplastic resin (b2) in the resin-impregnated, sheet-like, fiber-reinforced material (B) is preferably 15 to 60 mass %, and more preferably 35 to 45 mass %. When the ratio is less than 15 mass %, the affinity between the graft copolymer (a) and the sheet-like, fiber-reinforced material (b1) becomes insufficient and thus a prepreg lacks heat cycle resistance. On the other hand, increasing the ratio to more than 60 mass % can deteriorate heat cycle resistance of a prepreg because of sagging due to heat or migration caused by the thermoplastic resin (b2).

As a method for combining the graft copolymer (a), the sheet-like, fiber-reinforced material (b1), and the thermoplastic resin (b2), which are 3 components of a prepreg, a method of passing a film-form at the halfway stage to manufacture a thin film-form prepreg that can be used ultimately for a conductive layer-laminated substrate for a printed wiring board is advantageous in terms of equipment and for the purpose of preventing heterogeneous dispersion of the material. Specifically, as a method for manufacturing a prepreg, there is a method of subjecting the sheet-like preform (A) formed with the graft copolymer (a) and the resin-impregnated, sheet-like, fiber-reinforced material (B) formed by impregnating the sheet-like, fiber-reinforced material (b1) with the thermoplastic resin (b2) to thermal pressure adhesion.

<Sheet-Like Preform (A) Formed with Graft Copolymer (a)>

As a method for forming the sheet-like preform (A) by using the graft copolymer (a), the T-die method, the inflation molding method, the calender rolling method, or the press molding method may be used. A preferred molding method is the calender rolling method. In particular, the graft copolymer (a) is a resin containing a graft copolymer, conducting a calender roll molding at a temperature higher than the melting point of the resin by 20 to 30 degrees Celsius makes it possible to form a sheet-like preform having a uniform thickness.

<Resin-Impregnated, Sheet-Like, Fiber-Reinforced Material (B)>

A method for manufacturing the resin-impregnated, sheet-like, fiber-reinforced material (B) by impregnating the sheet-like, fiber-reinforced material (b1) with the thermoplastic resin (b2) is not particularly restricted and known methods may be used. Specifically, the thermoplastic resin (b2) is dissolved in an aromatic organic solvent such as toluene to prepare a varnish. The sheet-like, fiber-reinforced material (b1) is passed through the varnish so that the sheet-like, fiber-reinforced material (b1) absorbs the varnish. The solvent of the absorbed varnish is removed from the sheet-like, fiber-reinforced material (b1). Thus the sheet-like, fiber-reinforced material (b1) into which the thermoplastic resin (b2) is impregnated, namely the resin-impregnated, sheet-like, fiber-reinforced material (B), can be manufactured.

The ratio of the thermoplastic resin (b2) in the resin-impregnated, sheet-like, fiber-reinforced material (B) is determined as mentioned above so that the thermoplastic resin (b2) fills voids of a prepreg, prevent the generation of cracks, and enhance heat cycle resistance.

The proportions of the sheet-like, fiber-reinforced material (b1) and the thermoplastic resin (b2) can be generally controlled by changing the concentration of the thermoplastic resin (b2) in the varnish and the passing rate of the sheet-like, fiber-reinforced material (b1) through the varnish. For example, in the case of using the sheet-like, fiber-reinforced material (b1) that has a width of 0.3 m, typically, the concentration of the thermoplastic resin (b2) in the varnish is 10 to 20 mass % and the passing rate of the sheet-like, fiber-reinforced material (b1) through the varnish is 0.2 to 0.5 m/min.

<Thermal Pressure Adhesion of Sheet-Like Preform (A) and Resin-Impregnated, Sheet-Like, Fiber-Reinforced Material (B)>

The prepreg is manufactured by subjecting the sheet-like preform (A) and the resin-impregnated, sheet-like, fiber-reinforced material (B) to thermal pressure adhesion. As a method of conducting the thermal pressure adhesion, the vacuum press method or the belting press method may be used. And a preferred method is the vacuum press method. The resin-impregnated, sheet-like, fiber-reinforced material (B) is sandwiched between two sheets of the sheet-like preform (A), and thermal pressure adhesion is conducted at temperature and pressure with which the sheet-like preform (A) and the resin-impregnated, sheet-like, fiber-reinforced material (B) are heat seal sufficiently. The temperature of the thermal pressure adhesion is generally in the range of 160 to 300 degrees Celsius. The pressure of the thermal pressure adhesion is generally in the range of 2 to 10 MPa.

The prepreg may contain standard additives such as a lubricant, a plasticizing agent, a nucleator, an ultraviolet screening agent, a coloring agent, or a fire retardant additive without departing from of the object of the present invention. As a method of adding such additives, in view of the compatibility with the whole prepreg, addition to the graft copolymer (a) is easily conducted. The method of adding such additives is not particularly restricted, and there is a method using a Banbury mixer having a heating function and a kneading function, a pressure kneader, a roll, a single or twin screw extruder or the like. A method in which a twin screw extruder is used, a graft copolymer, an anti-oxidizing agent, and a fire retardant additive are fed from a main hopper, melted and kneaded, then a rod like molded article being extruded from dies is passed through a pelletizer to form pellets is preferable because it is convenient and inexpensive. As for the temperature for the melting and kneading, the melting and kneading may be conducted at a temperature in which the graft copolymer (a) softens sufficiently. And the temperature is generally in the range of 150 to 300 degrees Celsius.

<Conductive Layer-Laminated Substrate for a Printed Wiring Board>

Figure 3:
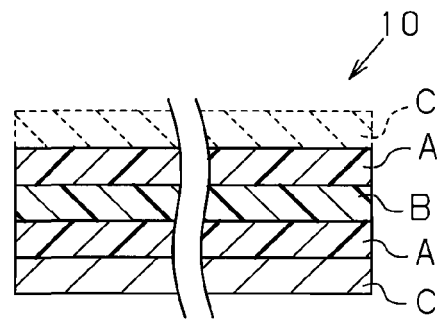
FIG. 3 shows a conductive layer-laminated substrate for a printed wiring board according to a preferred embodiment of the present invention.

As shown in FIG. 3, a conductive layer-laminated substrate 10 for a printed wiring board is manufactured by laminating or depositing a conductive layer C on both or either of the two major surfaces of the prepreg 1 and is suitable for use in high frequency signals. The thicknesses of the components A, B, and C in FIG. 3 are not to scale.

As a method for manufacturing a conductive layer-laminated substrate for a printed wiring board from a prepreg, a method of subjecting either or both of the major surfaces of a prepreg to a plating treatment, the vacuum press method or the belting press method may be used. And a preferred method is the vacuum press method as with the method of manufacturing a prepreg from the sheet-like preform (A) and the resin-impregnated, sheet-like, fiber-reinforced material (B). According to the vacuum press method, a conductive layer-laminated substrate for a printed wiring board is easily manufactured. The conductive layer may be a layer having a given wiring pattern. The conductive layer may be a monolayer or a multilayer in which layers are insulated from each other by an insulating layer.

As a material for the conductive layer used for a conductive layer-laminated substrate for a printed wiring board, metals or alloys such as copper, aluminum, iron, nickel, or zinc may be used. In case of necessity, the surface of the conductive layer may be subjected to a corrosion prevention treatment with metals such as chromium or molybdenum. The conductive layer may be manufactured by known techniques such as the electrolytic method or rolling method. The conductive layer generally has a thickness of about 0.003 to 1.5 mm. A metal layer functioning as the conductive layer can be formed directly on the outer layer of a prepreg by the vacuum deposition method or the plating method.

A prepreg or a conductive layer-laminated substrate for a printed wiring board according to the preferred embodiment has excellent high frequency signal transmission characteristics (low dielectric constant and low dielectric loss), and furthermore exhibits excellent durability under heat cycle environments repeating low temperature and high temperature. Therefore, the prepreg or the conductive layer-laminated substrate for a printed wiring board according to the preferred embodiment is applicable to electronic circuits for high-frequency bands that require high capabilities under harsh environments.

A prepreg according to the preferred embodiment is prepared by subjecting a film formed with the graft copolymer (a), namely the sheet-like preform (A), and the resin-impregnated, sheet-like, fiber-reinforced material (B) formed by impregnating the sheet-like, fiber-reinforced material (b1) with the thermoplastic resin (b2) to thermal pressure adhesion. Each of the graft copolymer (a) and the thermoplastic resin (b2) substantially consists of only nonpolar hydrocarbon groups or hydrocarbon skeletons and does not include polar groups having high dipole moment. And thus each of the graft copolymer (a) and the thermoplastic resin (b2) has high electrical insulating properties, thereby contributing to achieving high frequency signal transmission characteristics required for printed wiring boards.

The thermoplastic resin (b2) is a random or block copolymer comprising monomer units as with monomer units of the graft copolymer (a), thereby having sufficient affinity for the sheet-like, fiber-reinforced material (b1) such as glass fiber and sufficient compatibility with the graft copolymer (a). Use of the thermoplastic resin (b2) having the affinity and the compatibility is effective in reducing generation of cracks under heat cycles subjecting a prepreg or a conductive layer-laminated substrate for a printed wiring board to heating and cooling repeatedly.

According to the preferred embodiment, the following advantages are obtained.

Each of the graft copolymer (a) and the thermoplastic resin (b2) substantially consists of only nonpolar hydrocarbon groups or hydrocarbon skeletons, thereby imparting excellent high frequency signal transmission characteristics to a prepreg. In addition, the thermoplastic resin (b2) is formed with components as with those of the graft copolymer (a), thereby having excellent affinity for the sheet-like, fiber-reinforced material (b1) and excellent compatibility with the graft copolymer (a). Therefore, such a prepreg exhibits high heat cycle resistance.

A conductive layer-laminated substrate for a printed wiring board is obtained by providing a conductive layer for both or either surfaces of a prepreg and molding this prepreg. Therefore, a conductive layer-laminated substrate for a printed wiring board can exhibit effects of its prepreg.

Hereinafter, Reference Examples, Examples, and Comparative Examples will be described. The Examples are not intended to restrict the scope of the present invention.

Test methods for prepregs and conductive layer-laminated substrate for a printed wiring boards will be described.

<Measurement of Electric Characteristics>

Measurement of dielectric constant and dielectric loss: perturbation method with a cavity resonator (measuring frequency: 10 GHz). Test pieces were obtained by pressing a lamination of about 8 sheets of resins or prepregs having respective compositions with vacuum press equipment to obtain a molded article with about 1 mm thickness, and cutting the article by the size of 100 mm long, 1 mm wide and 1 mm thick. In Examples according to the present invention, prepregs that have a dielectric constant of 1.5 to 3.0 in high-frequency bands are suitably used. In addition, prepregs that have a dielectric loss of 0.0003 to 0.03 are suitably used. More preferably, the dielectric constant is 1.5 to 2.2, and the dielectric loss is 0.0003 to 0.003.

<Evaluation of Heat Cycle Resistance>

Through holes each having a diameter ($\phi$) of 2.00 mm were perforated at 2.00 mm spacings with 50 holes×10 rows in a conductive layer-laminated substrate for a printed wiring board of each composition to form direct current chain pattern plating. Substrates on which the pattern was formed were introduced to a device for evaluating heat cycle resistance. The evaluation of heat cycle resistance was conducted by continuity of the pattern and visually inspecting the condition of generating cracks on the surface of the substrate when 1000 cycles were accomplished. The continuity of the pattern was evaluated by measuring the resistivity of the conductor at the time of passing a current of 0.5 A and using rate of change from the initial value. Evaluation points will be described as follows.

<Rate of Change of Conductor Resistance>

No change: 5 points, less than or equal to 0.5%: 4 points, 0.5 to 1%: 3 points, exhibiting about 3% change and unstable value: 2 points, considerable increase of resistivity due to circuit disconnections and exhibiting more than or equal to 3% change: 1 point, and in the case of obviously identifying a phenomenon caused by disconnections: 0 point.

In addition, as for cracks on the surface of the substrate, the presence or absence of the cracks was visually inspected, and the number of cycle at the time of observing cracks was evaluated. Evaluation points will be shown as follows.

<Evaluation of Observing Cracks>

More than or equal to 1000 cycles and no cracks observed: 5 points, More than or equal to 800 cycles and no cracks observed: 4 points, More than or equal to 500 cycles and no cracks observed: 3 points, More than or equal to 300 cycles and no cracks observed: 2 points, More than or equal to 100 cycles and no cracks observed: 1 point, and Less than 100 cycles and cracks generated: 0 point.

In addition, cases in which test pieces could not be prepared in both items of the rate of change of conductor resistance and the observing cracks were given 0 point. In the evaluation of heat cycle resistance, practicable examples are necessary to get 3 points or more in both items.

Next, methods for manufacturing a sheet-like, fiber-reinforced material and a polymer material are shown as Reference Examples.

Reference Example 1

Manufacturing of Sheet-Like Preform (A) of Graft Copolymer (a)

2500 g of pure water was added to a stainless autoclave having an internal volume of 5 L, and then 2.5 g of polyvinyl alcohol was dissolved therein as a suspending agent. Then 700 g of propylene ethylene copolymer was added thereto, stirred and dispersed. Aside from this, 2.0 g of benzoyl peroxide as a radical polymerization initiator and 7.5 g of t-butyl peroxymethacryloyloxyethyl carbonate as a radical copolymerizable organic peroxide were dissolved in 100 g of divinylbenzene and 200 g of styrene which are aromatic vinyl monomers. This solution was introduced in the autoclave and stirred. Then the temperature of the autoclave was raised to 85 to 90 degrees Celsius and stirred for 2 hours to impregnate the aromatic vinyl monomers containing the radical polymerization initiator and the radical copolymerizable organic peroxide into propylene ethylene copolymer. Then the temperature was decreased to 75 to 85 degrees Celsius and the temperature was kept for 5 hours to complete polymerization. This solution was filtered, then washed and dried to obtain a grafted precursor.

Then this grafted precursor was extruded with Labo Plastomill monoaxial extruder (manufactured by Toyo Seiki Seisaku-sho, Ltd.) at 210 degrees Celsius and subjected to graft reaction to obtain a graft resin. In addition, this graft resin was dryblended with 100 g of 1,3,5-trimethyl-2,4,6-tris(3,5-di-t-butyl-4-hydroxybenzyl)benzene and 100 g of neopentane tetraylbis(2,6-di-t-butyl-4-methylphenyl)phosphite, then fed to a coaxial twin-screw extruder (TEX-30a, manufactured by The Japan Steel Works, LTD.) having a screw diameter of 300 mm and in which the cylinder temperature was controlled to be 210 degrees Celsius. After the extrusion, granulation was conducted to obtain a graft copolymer (a).

The graft copolymer (a) had MFR of 8 g/(10 min). In addition, the graft copolymer (a) was drawn with calender roll equipment (manufactured by Nippon Roll MFG. Co., Ltd.) at 170 degrees Celsius to obtain a sheet-like preform (A) of the graft copolymer (a).

Propylene ethylene copolymer: "SunAllomer PM671A" (product name, manufactured by SunAllomer Ltd.) (MFR: 7 g/(10 min))

Benzoyl peroxide: "NYPER BW" (product name, manufactured by NOF CORPORATION, purity: 75%, hydrous compound)

t-butyl peroxymethacryloyloxyethyl carbonate: manufactured by NOF CORPORATION, a 40% toluene solution 1,3,5-trimethyl-2,4,6-tris(3,5-di-t-butyl-4-hydroxybenzyl)benzene: "Irganox 1330" (product name, manufactured by Ciba Specialty Chemicals)

Neopentane tetraylbis(2,6-di-t-butyl-4-methylphenyl)phosphite: "ADK STAB PEP-36" (product name, manufactured by ADEKA CORPORATION)

Reference Examples 2 to 8

By using the method as with Reference Example 1, thermoplastic resins belonging to various matrix polymers and the graft copolymers (a) comprising aromatic vinyl monomers were obtained. The compositions thereof are shown in Table 1.

TABLE 1

|  |  | Reference Examples | | | | | | | |
|---|---|---|---|---|---|---|---|---|---|
|  |  | 1 | 2 | 3 | 4 | 5 | 6 | 7 | 8 |
| Components | Matrix polymer | PP | TPX | PP | PP | PP | TPX | PP | PP |
|  |  | 70 | 70 | 85 | 67 | 70 | 70 | 95 | 50 |
|  | aromatic monofunctional | St | St | MeSt | St | St | MeSt | St | St |
|  | vinyl monomer | 24 | 25 | 12 | 24 | 20 | 28 | 3 | 42 |
|  | monomer multifunctional monomer | DVB | DVB | DVB | DVB | DVB | DVB | DVB | DVB |
|  |  | 6 | 5 | 3 | 9 | 10 | 2 | 2 | 8 |
|  | radical copolymerizable organic peroxide | 1% | 3% | 3% | 1% | 1% | 3% | 3% | 1% |
|  | Code Name | PP706 | TPX705 | PP853 | PP679 | PP7010 | TPX702 | PP952 | PP508 |

PP: propylene ethylene copolymer (as with Reference Example 1)
St: styrene
DVB: divinylbenzene
TPX: 4-methyl-1-pentene decen-1 copolymer "TPX RT18" (product name, manufactured by Mitsui Chemicals, Inc.) (MFR: 26 g/(10 min))
MeSt: p-methylstyrene Reference Example 9

Manufacturing of Thermoplastic Resin (b2) Used for the Present Invention 4900 g of SBR(1), 100 g of divinylbenzene and 6.5 g of benzoyl peroxide were kneaded with a Banbury mixer under a nitrogen atmosphere at 200 degrees Celsius for 5 minutes to obtain pellets of a thermoplastic resin (b2).

In Table 2, the composition thereof is shown along with commercially available resins that were used as thermoplastic resins (b2) in Examples.

by KURARAY CO., LTD.) (MFR: 2.4 g/(10 min), 230 degrees Celsius/21.2 N)

SEPS2063: styrene-ethylene-propylene-styrene block copolymer "SEPTON 2063" (product name, manufactured by KURARAY CO., LTD.) (MFR: 7 g/(10 min), 230 degrees Celsius/21.2 N)

SEPS2004: styrene-ethylene-propylene-styrene block copolymer "SEPTON 2004" (product name, manufactured by KURARAY CO., LTD.) (MFR: 5 g/(10 min), 230 degrees Celsius/21.2 N)

TABLE 2

|  |  | Ref. Example No. or Resin Name | | | | |
|---|---|---|---|---|---|---|
|  |  | 9 | SEPS2007 | SEPS2063 | TTP1500 | SEPS2004 |
| Components | Ingredient #1 | SBR (1) | EPR | EPR | BR | EPR |
|  |  | 64 | 70 | 87 | 70 | 82 |
|  | aromatic Ingredient #2 | St | St | St | St | St |
|  | vinyl | 34 | 30 | 13 | 30 | 18 |
|  | monomer Ingredient #3 | DVB | none | none | none | none |
|  |  | 2 |  |  |  |  |
|  | Code Name | BR642 | EPR700 | EPR870 | BR700 | EPR820 |

Reference Examples 10 and 11

Manufacturing of Thermoplastic Resins that are not Used for (b2) of the Present Invention By using the method as with Reference Example 9, a thermoplastic resin and a thermoplastic resin derived from aromatic vinyl monomers were obtained. In Table 3, the compositions thereof are shown along with commercially available thermoplastic resins that were used in Comparative Examples for comparison with the present invention.

SBR(1): styrene-butadiene rubber "Nipol9526" (product name, manufactured by ZEON Corporation) (Mooney viscosity: 38)

SEPS2007: styrene-ethylene-propylene-styrene block copolymer "SEPTON 2007" (product name, manufactured SBR(2): styrene-butadiene rubber "Nipol2057S" (product name, manufactured by ZEON Corporation) (Mooney viscosity: 52)

TTP1500: hydrogenated butadiene-styrene block copolymer "Tuftec P1500" (product name, manufactured by Asahi Kasei Corporation) (MFR: 4 g/(10 min), 190 degrees Celsius/21.2 N)

TTP2000: hydrogenated butadiene-styrene block copolymer "Tuftec P2000" (product name, manufactured by Asahi Kasei Corporation) (MFR: 3 g/(10 min), 230 degrees Celsius/21.2 N)

PMMA: polymethyl methacrylate "Sumipex LG" (product name, manufactured by Sumitomo Chemical CO., LTD.) (MFR: 10 g/(10 min), 230 degrees Celsius/37.3 N)

TABLE 3

| | | Ref. Example No. or Resin Name | | | |
|---|---|---|---|---|---|
| | | 10 | 11 | TTP2000 | LG |
| Components | Ingredient #1 | SBR (2) 39 | SBR (1) 62 | BR 33 | PMMA 100 |
| | aromatic vinyl monomer Ingredient #2 | St 59 | St 33 | St 67 | none |
| | Ingredient #3 | DVB 2 | DVB 4 | none | none |
| | Code Name | BR392 | BR624 | BR330 | PMMA1000 |

Example 1

A sheet-like, fiber-reinforced material (b1) (glass cloth "Type 1067" (product name, manufactured by Asahi-Schwebel) was passed through a varnish obtained by dissolving EPR700 shown in Table 2 in 4 kg of toluene at a rate of 0.3 m/min and dried at 80 degrees Celsius for 2 hours to obtain a resin-impregnated, sheet-like, fiber-reinforced material (B). This was sandwiched between two sheets of the sheet-like preforms (A) in Reference Example 1 and subjected to thermal pressure adhesion with a vacuum pressing machine at 190 degrees Celsius to obtain a prepreg. In addition, the both surfaces of the prepreg were subjected to surface modification with UV-03 treatment device (manufactured by Sen Engineering). Then the prepreg was sandwiched between two sheets of 18 μm thick rolled copper foils (manufactured by Fukuda Metal Foil & Powder Co., Ltd.) and subjected to thermal pressure adhesion with a vacuum pressing machine to obtain a conductive layer-laminated substrate for a printed wiring board. The copper-clad substrate obtained by this method exhibited low dielectric constant and low dielectric loss in high-frequency bands, and excellent heat cycle resistance.

Examples 2 to 12

By using various graft copolymers (a) in Table 1, various sheet-like preforms (A) were obtained by the manufacturing method as with Example 1. Aside from this, various sheet-like, fiber-reinforced materials (b1) were impregnated with various thermoplastic resins (b2) shown in Table 2 to obtain resin-impregnated, sheet-like, fiber-reinforced materials (B). By using thus obtained films, copper-clad substrates for printed wiring boards were obtained by a method as with Example 1. Low dielectric constant and low dielectric loss in high-frequency bands, and heat cycle resistance of the copper-clad substrate obtained by the above methods are shown in Table 4.

TABLE 4

| | | | | Examples | | | | | | | | | | | |
|---|---|---|---|---|---|---|---|---|---|---|---|---|---|---|---|
| | | | | 1 | 2 | 3 | 4 | 5 | 6 | 7 | 8 | 9 | 10 | 11 | 12 |
| Components | (A) | (a) | Name | PP706 | PP679 | PP706 | TPX705 | TPX705 | PP706 | PP679 | PP7010 | TPX702 | TPX705 | PP7010 | PP706 |
| | | | % of (a) in a + b1 + b2 | 72 | 70 | 72 | 69 | 72 | 75 | 73 | 75 | 77 | 72 | 67 | 69 |
| | (B) | | % of (b1 + b2) in a + b1 + b2 | 28 | 30 | 28 | 31 | 28 | 25 | 27 | 25 | 23 | 28 | 33 | 31 |
| | | (b1) | Name | #1067 | #1080 | #1067 | #1080 | #1067 | #106 | #1067 | #106 | #1027 | #1067 | #1080 | #106 |
| | | | % of b1 in b1 + b2 | 64.3 | 83.3 | 64.3 | 83.9 | 71.4 | 60.0 | 70.4 | 60.0 | 52.2 | 71.4 | 75.8 | 45.2 |
| | | (b2) | Name | EPR700 | EPR870 | BR700 | EPR870 | BR642 | EPR870 | EPR700 | EPR820 | EPR820 | EPR700 | EPR870 | EPR700 |
| | | | % of b2 in b1 + b2 | 35.7 | 16.7 | 35.7 | 16.1 | 28.6 | 40.0 | 29.6 | 40.0 | 47.8 | 28.6 | 24.2 | 54.8 |
| Evaluation | | | dielectric constant | 2.2 | 2.35 | 2.2 | 2.3 | 2.15 | 2.2 | 2.25 | 2.2 | 2.05 | 2.2 | 2.35 | 2.15 |
| | | | dielectric loss | 0.0011 | 0.0014 | 0.0011 | 0.0013 | 0.001 | 0.0011 | 0.0011 | 0.0011 | 0.0007 | 0.0011 | 0.0014 | 0.0009 |
| | | | change of conductor resistance | 5 | 4 | 5 | 3 | 3 | 5 | 4 | 4 | 3 | 4 | 4 | 3 |
| | | | observing cracks | 4 | 4 | 4 | 4 | 3 | 5 | 4 | 4 | 3 | 4 | 4 | 4 |

1067: (style number, manufactured by Asahi-Schwebel) (specific gravity: 31 g/m$^2$, thickness: 32 μm)
1080: (style number, manufactured by Asahi-Schwebel) (specific gravity: 48 g/m$^2$, thickness: 55 μm)
106: (style number, manufactured by Asahi-Schwebel) (specific gravity: 25 g/m$^2$, thickness: 39 μm)
1027: glass cloth (style number, manufactured by Asahi-Schwebel) (specific gravity: 20 g/m$^2$, thickness: 20 μm)

As shown in Table 4, obtained conductive layer-laminated substrates for printed wiring boards of Examples 1 to 12 exhibited low dielectric constant and low dielectric loss in high-frequency bands, and preferable heat cycle resistance.

Comparative Examples 1 to 7

By using the method as with Reference Example 1, sheet-like preforms (A) formed with graft copolymers (a) shown in Table 1 derived from various matrix polymers and aromatic vinyl monomers. Aside from this, various sheet-like, fiber-reinforced materials (b1) were impregnated with various thermoplastic resins (b2) to obtain resin-impregnated, sheet-like, fiber-reinforced materials (B). By using the above films, conductive layer-laminated substrate for a printed wiring boards were obtained by the method as with Example 1. Low dielectric constant and low dielectric loss in high-frequency bands, and heat cycle resistance of thus obtained copper-clad substrates are shown in Table 5.

In Comparative Example 1, the ratio of (b1) and (b2) is larger in comparison with the ratio of graft copolymer (a) constituting the prepreg, and thus the amount of the thermoplastic resin (b2) for filling voids of the sheet-like, fiber-reinforced material (b1) could not be held. In addition, in Comparative Example 2, in the step of manufacturing the resin-impregnated, sheet-like, fiber-reinforced material (B) by impregnating the sheet-like, fiber-reinforced material with the varnish, the amount of the thermoplastic resin (b2) after the impregnation was small. In Comparative Example 3, the ratio of the sheet-like, fiber-reinforced material (b1) became large, and the actual amount of the thermoplastic resin (b2) was smaller than the amount of the thermoplastic resin (b2) required for filling voids of the sheet-like, fiber-reinforced material (b1). In the above cases, voids remain in prepregs and deteriorate heat cycle resistance. In particular, it was observed that many cracks were generated on the surfaces of the prepregs immediately.

In Comparative Example 4, thermal pressure adhesion was attempted between 65 parts by mass of a sheet-like preform formed with the graft copolymer obtained in Reference Example 7 and 35 parts by mass of a resin-impregnated, sheet-like, fiber-reinforced material (B) in which 74.3 mass % of the sheet-like, fiber-reinforced material (b1) was impregnated with 25.7 mass % of the thermoplastic resin (b2). However, the graft copolymer that was used contained a small content of 5 mass % of a polymer derived from an aromatic vinyl monomer and the graft copolymer is not the graft copolymer (a) used in the present invention. Therefore, the graft copolymer dissolved completely and outflowed at the molding temperature and it was impossible to maintain the shape of the prepreg and an evaluation sample could not be prepared.

In Comparative Example 5, the graft copolymer (a) lacked flowability. Adhesion between the sheet-like preform (A) and the resin-impregnated, sheet-like, fiber-reinforced material (B) was insufficient, and the sheet-like preform (A) came off from the resin-impregnated, sheet-like, fiber-reinforced material (B) and rate of change of conductor resistance became large under heat cycle environments.

In Comparative Example 6, the ratio of the aromatic vinyl monomer constituting the thermoplastic resin (b2) was excessive and the thermoplastic resin (b2) hardly flowed even at the temperature in which the sheet-like preform (A) became molten state. Therefore, adhesion between the sheet-like preform (A) and the resin-impregnated, sheet-like, fiber-reinforced material (B) was insufficient, and the sheet-like preform (A) came off from the resin-impregnated, sheet-like, fiber-reinforced material (B) and rate of change of conductor resistance became large under heat cycle environments.

In Comparative Example 7, thermal pressure adhesion was attempted between 72 parts by mass of the sheet-like preform (A) formed with the same graft copolymer as with Example 4 and a resin-impregnated, sheet-like, fiber-reinforced material (B) in which 71.4 mass % of the sheet-like, fiber-reinforced material (b1) was impregnated with 28.6 mass % of the thermoplastic resin prepared in Reference Example 10 instead of the thermoplastic resin (b2) used in the present invention. In the thermoplastic resin BR392, the ratio of an aromatic vinyl monomer unit in the copolymer was 61 mass %. Therefore, BR392 had an extremely low solubility in solvents, and the prepared varnish was whitish. By using this varnish, a resin-impregnated, sheet-like, fiber-reinforced material (B) was prepared, and thermal pressure adhesion was attempted between (B) and the sheet-like preform (A). However, thus obtained molded article of a prepreg had so many voids, and could not be used as an evaluation sample for high frequency signal transmission characteristics.

Comparative Example 8

As the thermoplastic resin (b2), a thermoplastic resin that did not include a polymer derived from an aromatic vinyl monomer was used, and the method as with Example 1 was used to obtain a resin-impregnated, sheet-like, fiber-reinforced material (B), a prepreg, and a conductive layer-laminated substrate for a printed wiring board.

The resin-impregnated, sheet-like, fiber-reinforced material (B) obtained by the method did not have sufficient adhesion to the graft copolymer (a), heat cycle resistance was impaired and high frequency signal transmission characteristics was deteriorated.

Comparative Example 9

In Comparative Example 9, by using the method as with Example 1 except that the thermoplastic resin (b2) was not used at all, a prepreg and a conductive layer-laminated substrate for a printed wiring board were obtained. In the manufacturing method that does not use the thermoplastic resin (b2), voids in the sheet-like, fiber-reinforced material (b1) cannot be filled completely. As a result, thus obtained prepreg and conductive layer-laminated substrate for a printed wiring board had voids therein. And the voids became the starting point to generate cracks under heat cycle environments.

1545: glass cloth (style number, manufactured by Asahi-Schwebel) (specific gravity: 165 $g/m^2$, thickness: 140 μm)

TABLE 5

|  |  |  |  | Comparative Examples | | | | | | | | |
|---|---|---|---|---|---|---|---|---|---|---|---|---|
|  |  |  |  | 1 | 2 | 3 | 4 | 5 | 6 | 7 | 8 | 9 |
| Components | (A) | (a) | Name | PP706 | PP7010 | PP706 | PP952 | PP508 | TPX705 | TPX705 | PP7010 | PP706 |
|  |  |  | % of (a) in a + b1 + b2 | 62 | 85 | 41 | 65 | 70 | 65 | 72 | 66 | 70 |
|  | (B) |  | % of (b1 + b2) in a + b1 + b2 | 38 | 15 | 59 | 35 | 30 | 35 | 28 | 34 | 30 |
|  |  | (b1) | Name | #1080 | #1027 | #1545 | #1080 | #1067 | #1080 | #1067 | #1080 | #1067 |
|  |  |  | % of b1 in b1 + b2 | 60.5 | 93.3 | 91.5 | 74.3 | 66.7 | 74.3 | 71.4 | 73.5 | 100.0 |
|  |  | (b2) | Name | EPR820 | EPR700 | EPR870 | EPR820 | EPR700 | BR330 | BR392 | PMMA1000 | none |
|  |  |  | % of b2 in b1 + b2 | 39.5 | 6.7 | 8.5 | 25.7 | 33.3 | 25.7 | 28.6 | 26.5 |  |
| Evaluation |  |  | dielectric constant | 2.30 | 2.15 | 2.75 | — | 2.25 | 2.30 | — | 2.60 | 2.50 |
|  |  |  | dielectric loss | 0.0013 | 0.0009 | 0.0029 | — | 0.0015 | 0.0013 | — | 0.033 | 0.0018 |
|  |  |  | change of conductor resistance | 3 | 4 | 3 | 0 | 2 | 1 | 0 | 3 | 3 |
|  |  |  | observing cracks | 1 | 2 | 1 | 0 | 1 | 1 | 0 | 3 | 2 |

It should be apparent to those skilled in the art that the present invention may be embodied in many other specific forms without departing from the spirit or scope of the invention. Particularly, it should be understood that the present invention may be embodied in the following forms.

One surface of the resin-impregnated, sheet-like, fiber-reinforced material (B) and the sheet-like preform (A) thereon may be subjected to thermal pressure adhesion. Also, each surface of the resin-impregnated, sheet-like, fiber-reinforced material (B) and the sheet-like preform (A) thereon may be subjected to thermal pressure adhesion, and a resin-impregnated, sheet-like, fiber-reinforced material (B) may be laminated thereon by thermal pressure adhesion.

In the graft copolymer (a) and the thermoplastic resin (b2), nonpolar α-olefin monomers and nonpolar conjugated diene monomers may be used in combination.

In the thermoplastic resin (b2), the random copolymer and the block copolymer may be used in combination.

The present examples and embodiments are to be considered as illustrative and not restrictive, and the invention is not to be limited to the details given herein, but may be modified within the scope and equivalence of the appended claims.

What is claimed is:

1. A prepreg comprising:
   a sheet-like preform; and
   a resin-impregnated, sheet-like, fiber-reinforced material thermal pressure adhered to the sheet-like preform, wherein:
   the sheet-like preform comprises a graft copolymer (a) having side chains that comprise 15 to 40 parts by mass of an aromatic vinyl monomer and a main chain that comprises 60 to 85 parts by mass of a random or block copolymer comprising monomer units selected from nonpolar α-olefin monomers and nonpolar conjugated diene monomers,
   the resin-impregnated, sheet-like, fiber-reinforced material comprises a sheet-like, fiber-reinforced material (b1) and a thermoplastic resin (b2) into which the sheet-like, fiber-reinforced material (b1) is impregnated, and
   the thermoplastic resin (b2) is a block copolymer having no graft structure and having a first polymer block composed of 60 to 90 mass % of a monomer unit, which is selected from nonpolar α-olefin monomers and nonpolar conjugated diene monomers, and a second polymer block 10 to 40 mass % of a monofunctional aromatic vinyl monomer unit.

2. The prepreg according to claim 1, wherein the sheet-like, fiber-reinforced material (b1) is a glass cloth.

3. The prepreg according to claim 1, wherein the aromatic vinyl monomer that provides the graft copolymer (a) or the thermoplastic resin (b2) is a styrene monomer.

4. The prepreg according to claim 1, wherein the graft copolymer (a) and the thermoplastic resin (b2) are formed with the same type of monomer.

5. The prepreg according to claim 1, wherein the graft copolymer (a) and the thermoplastic resin (b2) are electrical insulating materials.

6. A conductive layer-laminated substrate for a printed wiring board for high-frequency bands, the substrate comprising:
   the prepreg according to claim 1 that has two major surfaces; and
   a conductive layer laminated on at least one of the two major surfaces of the prepreg.

7. The conductive layer-laminated substrate according to claim 6, wherein the conductive layer includes a metal layer.

* * * * *

UNITED STATES PATENT AND TRADEMARK OFFICE
CERTIFICATE OF CORRECTION

PATENT NO. : 7,820,274 B2
APPLICATION NO. : 11/755374
DATED : October 26, 2010
INVENTOR(S) : Toshihiro Ohta et al.

It is certified that error appears in the above-identified patent and that said Letters Patent is hereby corrected as shown below:

Assignee
After "NOF Corporation, Tokyo (JP)" the assignee -- TDK Corporation, Tokyo (JP) -- should also be listed Signed and Sealed this Seventh Day of December, 2010

David J. Kappos
*Director of the United States Patent and Trademark Office*